US011187751B2

(12) United States Patent
Han et al.

(10) Patent No.: US 11,187,751 B2
(45) Date of Patent: Nov. 30, 2021

(54) RELAY OPERATION STATE MAINTAINING DEVICE AND ELECTRONIC DEVICE INCLUDING THE SAME

(71) Applicant: Samsung SDI Co., Ltd., Yongin-si (KR)

(72) Inventors: Sangtaek Han, Yongin-si (KR);
Seungho Han, Yongin-si (KR);
Jeongguk Bae, Yongin-si (KR);
Hyuncheol Jeon, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 133 days.

(21) Appl. No.: 16/561,539

(22) Filed: Sep. 5, 2019

(65) Prior Publication Data
US 2020/0088792 A1 Mar. 19, 2020

(30) Foreign Application Priority Data
Sep. 17, 2018 (KR) .................. 10-2018-0111029

(51) Int. Cl.
*G01R 31/327* (2006.01)
*H02J 9/04* (2006.01)

(52) U.S. Cl.
CPC ............ *G01R 31/3278* (2013.01); *H02J 9/04* (2013.01)

(58) Field of Classification Search
CPC ..... G01R 31/3278; H02J 9/04; H01H 47/002; H01H 47/04
See application file for complete search history.

(56) References Cited

U.S. PATENT DOCUMENTS 8,139,333 B2 * 3/2012 Imai .................. H01H 47/32
361/59
8,467,159 B2 * 6/2013 Jung .................. B60K 6/28
361/23
(Continued)

FOREIGN PATENT DOCUMENTS

CN    2211650 Y    11/1995
CN    1911658 A    2/2007
(Continued)

OTHER PUBLICATIONS

EPO Extended Search dated Feb. 3, 2020, for corresponding European Patent Application No. 19197889.9 (5 pages).
(Continued)

*Primary Examiner* — Walter L Lindsay, Jr.
*Assistant Examiner* — Milton Gonzalez
(74) *Attorney, Agent, or Firm* — Lewis Roca Rothgerber Christie LLP

(57) ABSTRACT

In a relay operation state maintaining device configured to maintain an operation state of a relay when an abnormality occurs in a controller configured to control an operation of the relay, the relay operation state maintaining device includes: a memory configured to store a relay control signal output for an operation of the relay by the controller at a time the abnormality occurs and to generate and output a memory output signal based on a stored signal; a first relay driving signal generator configured to generate and output a first relay driving signal based on the relay control signal and a signal corresponding to the abnormality occurrence; and a second relay driving signal generator configured to generate and output a second relay driving signal based on the first relay driving signal and the memory output signal.

20 Claims, 4 Drawing Sheets

(56) References Cited

U.S. PATENT DOCUMENTS

| | | | |
|---|---|---|---|
| 8,513,836 B2 | 8/2013 | Zushi et al. | |
| 8,977,416 B2 * | 3/2015 | Park | B60L 3/0092 |
| | | | 701/22 |
| 8,983,695 B2 * | 3/2015 | Park | B60L 50/51 |
| | | | 701/22 |
| 2007/0030595 A1 | 2/2007 | Tsukamoto | |
| 2009/0174981 A1 | 7/2009 | Mallon et al. | |
| 2017/0040982 A1 | 2/2017 | Miao et al. | |
| 2019/0368767 A1 | 12/2019 | Mikami | |

FOREIGN PATENT DOCUMENTS

| | | |
|---|---|---|
| CN | 102088245 A | 6/2011 |
| EP | 3406983 A1 | 11/2018 |
| KR | 10-1533813 B1 | 7/2015 |
| KR | 10-2016-0145744 A | 12/2016 |
| KR | 10-1725499 B1 | 4/2017 |
| KR | 10-1744772 B1 | 6/2017 |
| WO | 2018/150521 A1 | 8/2018 |
| WO | WO 2018/150521 A1 | 8/2018 |

OTHER PUBLICATIONS

Chinese Office Action dated May 31, 2021, issued in corresponding Chinese Patent Application No. 201910875592.4 (6 pages).

* cited by examiner

RELAY OPERATION STATE MAINTAINING DEVICE AND ELECTRONIC DEVICE INCLUDING THE SAME

CROSS-REFERENCE TO RELATED APPLICATION

This application claims priority to and the benefit of Korean Patent Application No. 10-2018-0111029, filed on Sep. 17, 2018, in the Korean Intellectual Property Office, the disclosure of which is incorporated herein in its entirety by reference.

BACKGROUND

1. Field

Aspects of one or more example embodiments relate to a relay operation state maintaining device and an electronic device including the same.

2. Description of Related Art

Recently, with the development of electric vehicles and energy storage device technologies, technologies related to battery packs have been developed and such battery packs have been designed to have higher voltage and capacity in order to drive devices.

Such battery packs may be connected through relays to electronic devices driven by the battery packs; however, when an abnormality occurs in the system of an electronic device, a control signal for controlling such a relay may not be maintained, which may cause a serious accident or pose a safety hazard.

For example, when a controller for controlling relays is reset due to the occurrence of an abnormality in the controller in an electric vehicle driven by a battery, the electrical connection between a battery pack and a vehicle body may be unintentionally released. However, when the electrical vehicle is traveling at high speed, the release of such electrical connection may lead to a fatal accident.

The above information disclosed in this Background section is only for enhancement of understanding of the background and therefore the information discussed in this Background section does not necessarily constitute prior art.

SUMMARY

Aspects of one or more embodiments of the present disclosure may include a system configured to maintain an operation state of a relay even in a failure situation of a control device controlling the relay.

For example, one or more embodiments of the present disclosure may include a system configured to prevent or reduce instances of an unintended opening of a relay to improve the reliability of a device including the relay.

Also, one or more embodiments of the present disclosure may include a system configured to maintain an operation state of a relay for a certain time in a failure situation of a control device controlling the relay.

Additional aspects will be set forth in part in the description which follows and, in part, will be more apparent from the description, or may be learned by practice of the presented embodiments of the disclosure.

According to some embodiments, a relay operation state maintaining device for maintaining an operation state of a relay when an abnormality occurs in a controller controlling an operation of the relay includes: a memory storing a relay control signal output for an operation of the relay by the controller at the time the abnormality occurs and generating and outputting a memory output signal based on a stored signal; a first relay driving signal generator generating and outputting a first relay driving signal based on the relay control signal and a signal corresponding to the abnormality occurrence; and a second relay driving signal generator generating and outputting a second relay driving signal based on the first relay driving signal and the memory output signal.

According to some example embodiments, the memory, the first relay driving signal generator, and the second relay driving signal generator may be operated by a second power supply separate from a first power supply that supplies power to the controller.

According to some example embodiments, the relay operation state maintaining device may further include a signal delayer delaying the relay control signal of the controller by a certain time interval to generate and output a delayed relay control signal. In this case, the memory may store the delayed relay control signal within the certain time interval from the time the abnormality occurs and generate and output the memory output signal based on a stored signal.

According to some example embodiments, the relay operation state maintaining device may further include a timer generating a timer output signal during a certain maintenance period from the time a triggering signal is input.

According to some example embodiments, the memory may generate and output the memory output signal only while the timer output signal is input.

According to some example embodiments, the relay operation state maintaining device may further include an edge detector generating the triggering signal based on the signal corresponding to the abnormality occurrence and outputting the triggering signal to the timer.

According to some example embodiments, the first relay driving signal generator may generate and output the first relay driving signal based on an AND operation result of the relay control signal and the signal corresponding to the abnormality occurrence.

According to some example embodiments, the second relay driving signal generator may generate and output the second relay driving signal based on an OR operation result of the first relay driving signal and the memory output signal.

According to some example embodiments, the second relay driving signal may be output to a relay driver controlling an operation of the relay.

According to some example embodiments, the relay may include a first relay and a second relay, the memory may store each of a first relay control signal output for an operation of the first relay and a second relay control signal output for an operation of the second relay by the controller at the time the abnormality occurs and output each of the first memory output signal and the second memory output signal based on a stored signal, the first relay driving signal generator may include: a (1-1)th relay driving signal generator generating and outputting a (1-1)th relay driving signal based on the first relay control signal and the signal corresponding to the abnormality occurrence; and a (1-2)th relay driving signal generator generating and outputting a (1-2)th relay driving signal based on the second relay control signal and the signal corresponding to the abnormality occurrence, and the second relay driving signal generator may include: a (2-1)th relay driving signal generator generating and outputting a (2-1)th relay driving signal based on the (1-1)th relay driving signal and the first memory output signal; and a (2-2)th relay driving signal generator generating and outputting a (2-2)th relay driving signal based on the (1-2)th relay driving signal and the second memory output signal.

According to some example embodiments, an electronic device which includes a relay operation state maintaining device for maintaining an operation state of a relay when an abnormality occurs in a controller controlling an operation of the relay and of which third power supply is adjusted by the relay includes: the relay controlling the third power supply to the electronic device; a relay driver controlling an operation of the relay based on a second relay driving signal; and the relay operation state maintaining device generating and outputting the second relay driving signal for maintaining an operation state of the relay when the abnormality occurs.

According to some example embodiments, the relay operation state maintaining device may include: a memory storing a relay control signal output for an operation of the relay by the controller at the time the abnormality occurs and generating and outputting a memory output signal based on a stored signal; a first relay driving signal generator generating and outputting a first relay driving signal based on the relay control signal and a signal corresponding to the abnormality occurrence; and a second relay driving signal generator generating and outputting the second relay driving signal based on the first relay driving signal and the memory output signal.

According to some example embodiments, the memory, the first relay driving signal generator, and the second relay driving signal generator may be operated by a second power supply separate from a first power supply that supplies power to the controller, and the first power supply, the second power supply, and the third power supply may be separate power supplies.

According to some example embodiments, the relay operation state maintaining device may further include a signal delayer delaying the relay control signal of the controller by a certain time interval to generate and output a delayed relay control signal, and the memory may store the delayed relay control signal within the certain time interval from the time the abnormality occurs and generate and output the memory output signal based on a stored signal.

According to some example embodiments, the relay operation state maintaining device may further include a timer generating a timer output signal during a certain maintenance period from the time a triggering signal is input.

According to some example embodiments, the memory may generate and output the memory output signal only while the timer output signal is input.

According to some example embodiments, the relay operation state maintaining device may further include an edge detector generating the triggering signal based on the signal corresponding to the abnormality occurrence and outputting the triggering signal to the timer.

According to some example embodiments, the first relay driving signal generator may generate and output the first relay driving signal based on an AND operation result of the relay control signal and the signal corresponding to the abnormality occurrence, and the second relay driving signal generator may generate and output the second relay driving signal based on an OR operation result of the first relay driving signal and the memory output signal.

According to some example embodiments, the second relay driving signal may be output to a relay driver controlling an operation of the relay.

According to some example embodiments, the relay may include a first relay and a second relay, the memory may store each of a first relay control signal output for an operation of the first relay and a second relay control signal output for an operation of the second relay by the controller at the time the abnormality occurs and output each of the first memory output signal and the second memory output signal based on a stored signal, the first relay driving signal generator may include: a (1-1)th relay driving signal generator generating and outputting a (1-1)th relay driving signal based on the first relay control signal and the signal corresponding to the abnormality occurrence; and a (1-2)th relay driving signal generator generating and outputting a (1-2)th relay driving signal based on the second relay control signal and the signal corresponding to the abnormality occurrence, and the second relay driving signal generator may include: a (2-1)th relay driving signal generator generating and outputting a (2-1)th relay driving signal based on the (1-1)th relay driving signal and the first memory output signal; and a (2-2)th relay driving signal generator generating and outputting a (2-2)th relay driving signal based on the (1-2)th relay driving signal and the second memory output signal.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
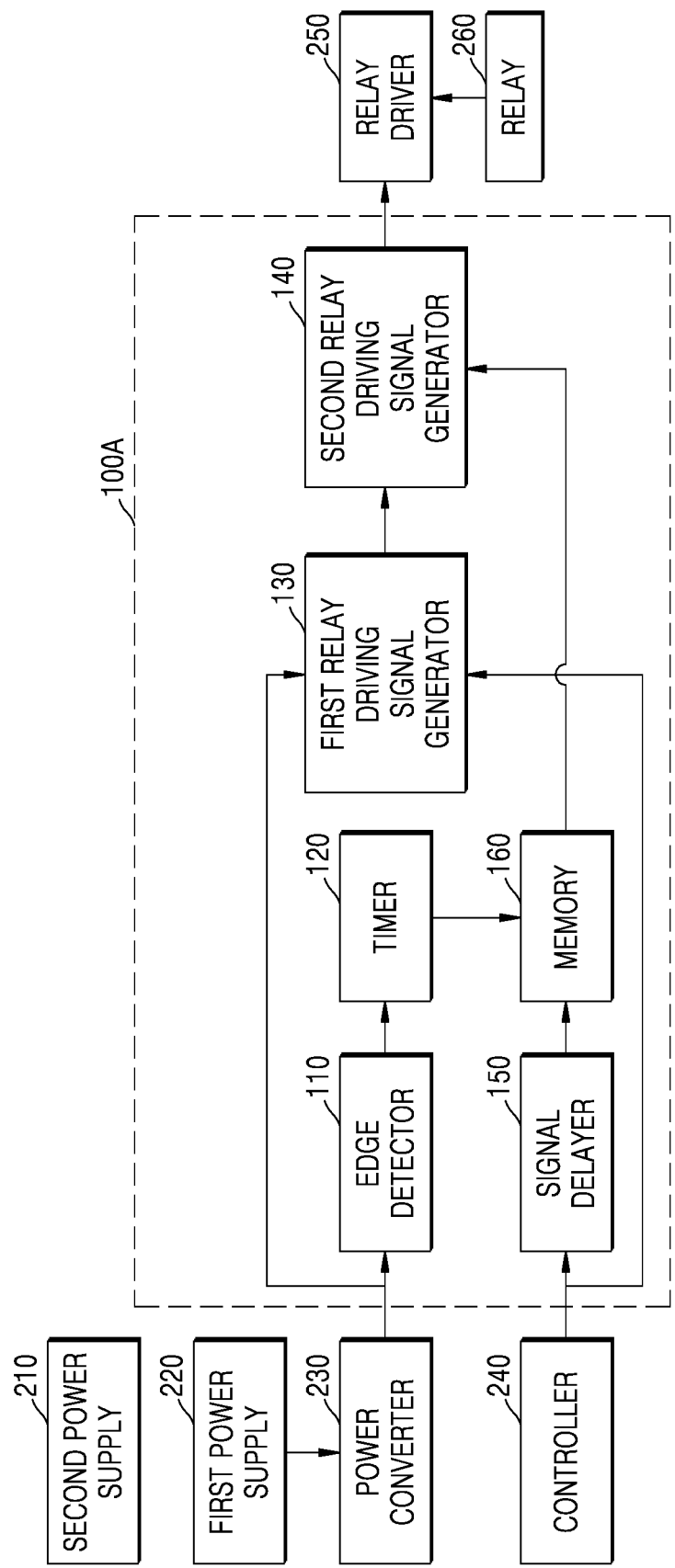
FIG. 1 illustrates a configuration of a system including a relay operation state maintaining device according to some example embodiments of the present disclosure.

Reference will now be made in more detail to aspects of some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The aspects and features of the present disclosure and the accomplishing methods thereof will become more apparent from the following description of example embodiments taken in conjunction with the accompanying drawings.

However, it should be understood that embodiments according to the present disclosure are not limited to the example embodiments described below but may be embodied in various different forms and may include all modifications, equivalents, and alternatives falling within the spirit and scope of the present disclosure. The example embodiments described below are provided so that the present disclosure will be more thorough and more complete and will more fully convey the scope of the present disclosure to those of ordinary skill in the art. In the following description of the present disclosure, certain detailed descriptions of the related art will be omitted when it is deemed that they may unnecessarily obscure the subject matters of the present disclosure.

For example, example shapes, structures, and features described herein may be modified from some embodiments to other embodiments without departing from the spirit and scope of the present disclosure. Also, it will be understood that the position or arrangement of individual components in each embodiment may be modified without departing from the spirit and scope of the present disclosure. Thus, the following detailed description should be considered in a descriptive sense only and not for purposes of limitation, and the scope of the present disclosure should be construed as including the appended claims and all equivalents thereof. In the drawings, like reference numerals will denote like elements throughout various aspects. That is, particular details described herein are merely examples. Particular embodiments may vary from these example details and may still be contemplated within the spirit and scope of the present disclosure.

The terminology used herein is for the purpose of describing particular embodiments only and is not intended to limit the present disclosure. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof. Although terms such as "first" and "second" may be used herein to describe various elements or components, these elements or components should not be limited by these terms. These terms are only used to distinguish one element or component from another element or component.

Hereinafter, aspects of some example embodiments of the present disclosure will be described in more detail with reference to the accompanying drawings, and in the following description, like reference numerals will be used to denote like elements and redundant descriptions thereof will be omitted for conciseness.

FIG. 1 illustrates a configuration of a system including a relay operation state maintaining device 100A according to some example embodiments of the present disclosure.

The relay operation state maintaining device 100A according to some example embodiments of the present disclosure may maintain an operation state of a relay 260 when an abnormality occurs in a controller 240 controlling an operation of the relay 260.

For example, the relay operation state maintaining device 100A may maintain a conventional state of the relay 260 in order to prevent or reduce instances of an unintended transition of the relay 260 to an on state or an off state, which may occur when the supply of a first power supply 220 to the controller 240 is temporarily interrupted.

Herein, the relay 260 may be various types of switching units for controlling the electrical connection between two nodes. For example, the relay 260 may include any one of an electromagnetic relay, a solid state relay, and a non-contact relay. In this case, the relay 260 may be configured in any one of a single pole single throw (SPST) mode, a single pole double throw (SPDT) mode, and a double pole double throw (DPDT) mode.

However, the above types and modes of the relay 260 are merely examples and embodiments according to the present disclosure are not limited thereto. Thus, any suitable unit capable of controlling the electrical connection between two nodes according to a control signal may be used herein without limitation.

Herein, the relay 260 may have at least two operation states. For example, the relay 260 may have an On state and an Off state. The On state may be a state where two contacts to which the relay 260 is connected are electrically connected, that is, a conduction (or short) state. The Off state may be a state where two contacts to which the relay 260 is connected are electrically disconnected, that is, an open state.

Two nodes connected to the relay 260 may be, for example, a power supply node of an electronic device and a load node of the electronic device. In other words, the relay 260 may be arranged on a high current path of the electronic device and may be used to control a high current. This will be described below in more detail with reference to FIG. 4.

The operation state of the relay 260 may be changed by a relay driver 250. In this case, the relay driver 250 may change the operation state of the relay 260 based on a control signal generated by the controller 240 or the like.

According to some example embodiments, the relay 260 and the relay driver 250 may be separate components as illustrated in FIG. 1 or may be configured as an integrated relay unit.

The controller 240 according to some example embodiments of the present disclosure may be a unit for controlling the relay 260 according to a certain control algorithm. Herein, the controller 240 may be, for example, a data processing device that is embedded in hardware and has a physically structured circuit to perform a function represented by a command or code in a program. As an example, the data processing device embedded in hardware may include any processing device such as a microprocessor, a central processing unit (CPU), a processor core, a multiprocessor, an application-specific integrated circuit (ASIC), or a field programmable gate array (FPGA); however, embodiments according to the present disclosure are not limited thereto.

The controller 240 may be included in the relay operation state maintaining device 100A or may be included in an electronic device including the relay operation state maintaining device 100A. However, this is merely an example and embodiments according to the present disclosure are not limited thereto.

The relay operation state maintaining device 100A according to some example embodiments of the present disclosure may include an edge detector 110, a timer 120, a first relay driving signal generator 130, a second relay driving signal generator 140, a signal delayer 150, and a memory 160 in order to maintain the operation state of the relay 260 described above.

The memory 160 according to some example embodiments of the present disclosure may store a relay control signal that is output by the controller 240 to control an operation of the relay 260 at the time an abnormality occurs in the controller 240. In this case, "the time an abnormality occurs" may mean the time when an abnormality occurs in the controller 240 or may mean the time within a certain time interval from the time when the abnormality occurs. Accordingly, "a relay control signal output for an operation of the relay 260 by the controller 240 at the time the abnormality occurs" may mean a signal that is expected to be output by the controller 240 assuming that an abnormality has not occurred in the controller 240.

For example, when the controller 240 has output a High signal corresponding to the On state of the relay 260 at the time an abnormality occurs in the controller 240, the memory 160 may store such a High signal.

For this, the memory 160 may store a delayed relay control signal generated by the signal delayer 150, which will be described below, within a certain time interval from the time an abnormality occurs in the controller 240 and generate and output a memory output signal based on a stored signal. In this case, the delayed relay control signal generated by the signal delayer 150 within a certain time interval from the time an abnormality occurs in the controller 240 may mean the same as a sampled relay control signal.

The memory 160 may include various units capable of temporarily recording signals. For example, the memory 160 may include memory elements such as latches and/or flip-flops. However, this is merely an example and embodiments according to the present disclosure are not limited thereto.

The memory 160 may be operated by a second power supply 210 that is separate from the first power supply 220. In this case, the first power supply 220 may include a power supply for operating the controller 240. Thus, even when the abnormality of the controller 240 is caused by the abnormality of the first power supply 220, the memory 160 may operate normally regardless of the abnormality of the first power supply 220.

The memory 160 may generate the memory output signal based on the stored signal and output the generated memory output signal to the second relay driving signal generator 140, which will be described below. In this case, the memory 160 may generate and output the memory output signal only while a timer output signal generated by the timer 120 is input, which will be described below.

The first relay driving signal generator 130 according to some example embodiments of the present disclosure may generate and output a first relay driving signal based on a signal corresponding to the abnormality occurrence in the controller 240 and the relay control signal generated by the controller 240.

According to some example embodiments of the present disclosure, "the signal corresponding to the abnormality occurrence in the controller 240" may be generated by a power converter 230 and then transmitted to the first relay driving signal generator 130.

The power converter 230 according to some example embodiments of the present disclosure may periodically receive a certain signal from the controller 240 when the controller 240 is in a normal state and output a signal corresponding thereto to the first relay driving signal generator 130 or the like. For example, the power converter 230 may output a High signal when the controller 240 is in a normal state.

When the controller 240 fails to receive a certain signal from the controller 240 due to the abnormality occurrence in the controller 240, the power converter 230 may output a signal corresponding to the abnormality occurrence in the controller 240 to the first relay driving signal generator 130 or the like. For example, the power converter 230 may output a Low signal when an abnormality occurs in the controller 240.

According to some example embodiments, when the power converter 230 fails to receive a certain signal from the controller 240, the power converter 230 may generate a signal for resetting the controller 240 and output the signal to the controller 240.

That is, the power converter 230 may operate as a watchdog of the controller 240. However, this is merely an example and embodiments according to the present disclosure are not limited thereto. Thus, as for a device that monitors the state of the controller 240 in real time in addition to the power converter 230 and outputs a signal corresponding to the state of the controller 240, the device may be used instead of or together with the power converter 230.

"The relay control signal generated by the controller 240", which is used as a base signal when the first relay driving signal generator 130 generates the first relay driving signal, may mean a signal that is currently generated by the controller 240 for control of the relay 260, as its name suggests.

For example, even when the controller 240 outputs a High signal corresponding to the On state of the relay 260 at the time an abnormality occurs in the controller 240, the relay control signal generated by the controller 240 after the time the abnormality occurs may be a Low signal corresponding to the Off state of the relay 260. Herein, the Low signal may include not only a signal that is output when the controller 240 generates a Low signal according to a certain logic, but also a signal that is naturally output when the controller 240 does not generate a High signal or generates no output.

Thus, when the controller 240 does not generate and output the control signal for the relay 260 due to the reset of the controller 240 or the like, the relay control signal generated by the controller 240 may be regarded as a Low signal corresponding to the Off state of the relay 260.

The first relay driving signal generator 130 may generate and output a first relay driving signal based on an AND operation (i.e., an AND logic operation) result of the signal corresponding to the abnormality occurrence generated by the power converter 230 and the relay control signal generated by the controller 240.

For example, when both the signals (i.e., the signal corresponding to the abnormality occurrence and the relay control signal) are High signals, the first relay driving signal generator 130 may generate and output the first relay driving signal as a High signal. When at least one of both the signals (i.e., the signal corresponding to the abnormality occurrence and the relay control signal) is a Low signal, the first relay driving signal generator 130 may generate and output the first relay driving signal as a Low signal.

The second relay driving signal generator 140 according to some example embodiments of the present disclosure may generate and output a second relay driving signal based on the first relay driving signal and the memory output signal. In this case, the first relay driving signal may be generated by the first relay driving signal generator 130 described above. Also, the memory output signal may be generated by the memory 160 described above.

The second relay driving signal generator 140 according to some example embodiments of the present disclosure may generate and output a second relay driving signal based on an OR operation (i.e., an OR logic operation) result of the first relay driving signal and the memory output signal.

For example, when both the signals (i.e., the first relay driving signal and the memory output signal) are Low signals, the second relay driving signal generator 140 may generate and output the second relay driving signal as a Low signal. When at least one of both the signals (i.e., the first relay driving signal and the memory output signal) is a High signal, the second relay driving signal generator 140 may generate and output the second relay driving signal as a High signal. The second relay driving signal generated by the second relay driving signal generator 140 may be output to the relay driver 250, which controls an operation of the relay 260, to control an operation of the relay 260.

The first relay driving signal generator 130 and the second relay driving signal generator 140 may include various logic gate elements. For example, the first relay driving signal generator 130 may include an AND gate, and the second relay driving signal generator 140 may include an OR gate.

Circuits respectively implemented by the AND gate of the first relay driving signal generator 130 and the OR gate of the second relay driving signal generator 140 may be integrated and implemented as one circuit using a selector or a mux (multiplexer).

Also, the first relay driving signal generator 130 and the second relay driving signal generator 140 may be operated by the second power supply 210, like the memory 160. Thus, even when the abnormality of the controller 240 is caused by the abnormality of the first power supply 220, the first relay driving signal generator 130 and the second relay driving signal generator 140 may operate normally together with the memory 160 regardless of the abnormality of the first power supply 220.

The signal delayer 150 according to some example embodiments of the present disclosure may delay the relay control signal of the controller 240 by a certain time interval to generate and output a delayed relay control signal. For example, when the certain time interval is 5 ms, the signal delayer 150 may generate and output a delayed relay control signal delayed by 5 ms with respect to the relay control signal of the controller 240. The delayed relay control signal may mean a sampled signal for storage in the memory 160, as described above.

The timer 120 according to some example embodiments of the present disclosure may generate a timer output signal during a certain maintenance period from the time a triggering signal is input. As described above, because the memory 160 generates and outputs the memory output signal only while the timer output signal generated by the timer 120 is input, the timer output signal may be understood as a means of adjusting the output period of the memory output signal of the memory 160. The length of "the certain maintenance period" may be variously determined according to the design and/or purpose of the system.

The triggering signal for starting the operation of the timer 120 may be generated and output by the edge detector 110.

The edge detector 110 may generate the triggering signal based on the signal corresponding to the abnormality occurrence generated by the power converter 230 and output the generated triggering signal to the timer 120. The triggering signal may be, for example, a pulse-shaped signal and may be a signal including a rising edge or a falling edge at the time corresponding to the abnormality occurrence.

The edge detector 110, the timer 120, and the signal delayer 150 may also be operated by the second power supply 210, like the other components of the relay operation state maintaining device 100A.

Thus, even when the abnormality of the controller 240 is caused by the abnormality of the first power supply 220, the relay operation state maintaining device 100A may overall operate normally regardless of the abnormality of the first power supply 220 to stably maintain the operation state of the relay 260.

Figure 2:
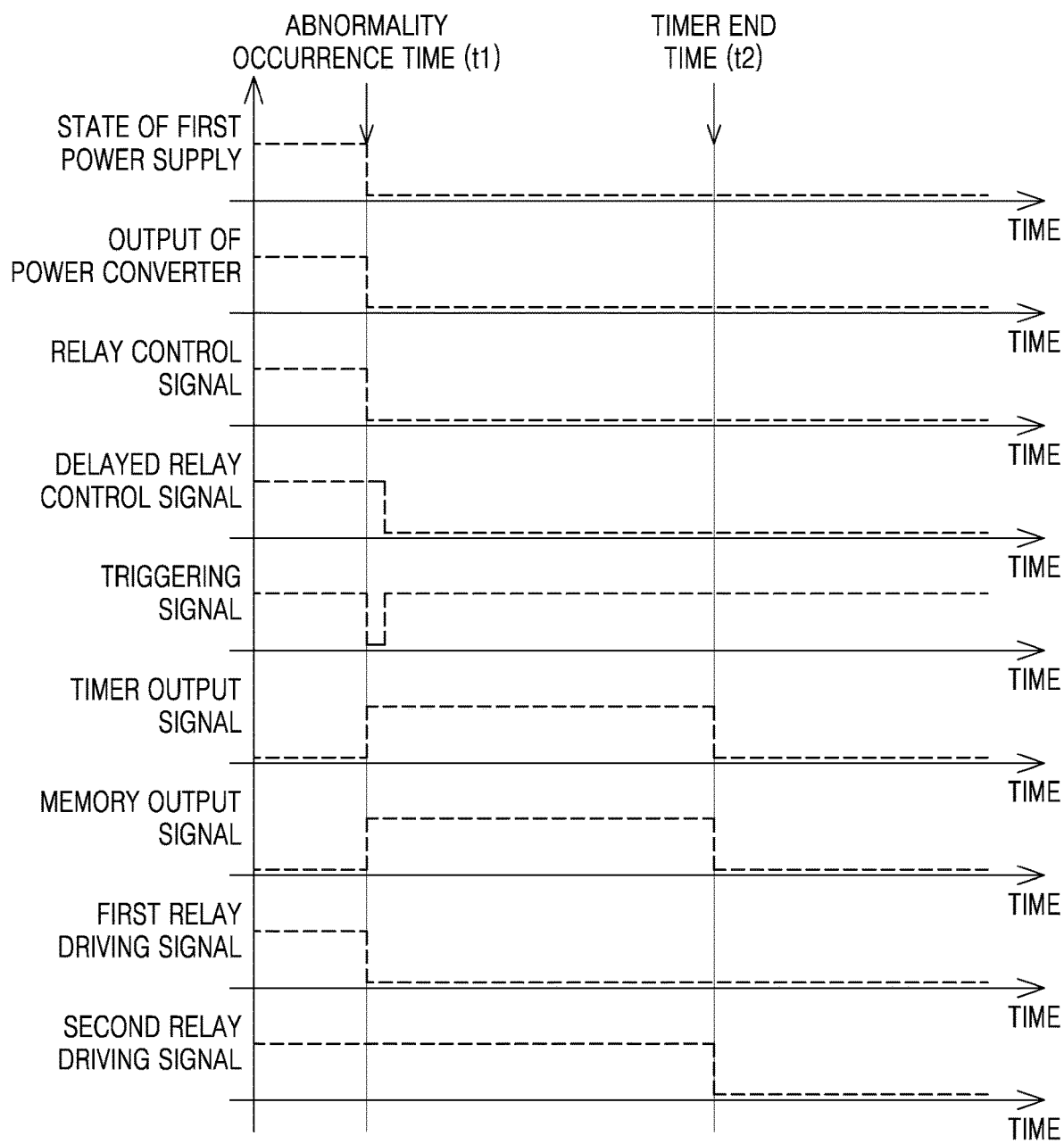
FIG. 2 is a diagram of a method of operating a relay operation state maintaining device, according to some example embodiments of the present disclosure.

FIG. 2 is a diagram of a method of operating the relay operation state maintaining device 100A, according to some example embodiments of the present disclosure.

Hereinafter, for convenience of description, it is assumed that an abnormality has occurred in the controller 240 that outputs a High signal as a relay control signal at an abnormality occurrence time t1 due to the supply interruption of the first power supply 220. Also, it is assumed that the timer 120 ends the output of a timer output signal at a timer end time t2.

According to the above assumptions, the first power supply 220 may be in a Low state at the time t1, as illustrated in FIG. 2. Also, the controller 240 may output a relay control signal of a Low state from the time t1 due to the supply interruption of the first power supply 220. The signal delayer 150 may delay the relay control signal of the controller 240 by a certain time interval to generate and output a delayed relay control signal.

The power converter 230 according to some example embodiments of the present disclosure may output a signal corresponding to the abnormality occurrence in the controller 240, as illustrated in FIG. 2. The signal output by the power converter 230 may be transmitted to the edge detector 110 and the first relay driving signal generator 130 as described above.

When receiving the signal corresponding to the abnormality occurrence in the controller 240 from the power converter 230, the edge detector 110 may generate a pulse-shaped triggering signal having a falling edge at the time t1 as illustrated in FIG. 2 and transmit the same to the timer 120.

During a certain maintenance period from the time the triggering signal described above is input, the timer 120 may generate a timer output signal and output the same to the memory 160. In this case, the certain maintenance period may be, for example, a period corresponding to the difference between the timer end time t2 and the abnormality occurrence time t1.

The memory 160 may generate and output a memory output signal only while the timer output signal is input (i.e., only from the time t1 to the time t2). In this case, the memory output signal may be generated based on the sampling result of the delayed relay control signal described above. In other words, the memory 160 may store the delayed relay control signal generated by the signal delayer 150, within a certain time interval from the time an abnormality occurs in the controller 240 (i.e., the time t1) and generate and output the memory output signal based on the stored signal.

From the time t1, the first relay driving signal generator 130 may generate and output a first relay driving signal based on the signal corresponding to the abnormality occurrence in the controller 240 and the relay control signal generated by the controller 240. In this case, the first relay driving signal generator 130 may generate and output a first relay driving signal based on an AND operation (i.e., an AND logic operation) result of the signal corresponding to the abnormality occurrence generated by the power converter 230 and the relay control signal generated by the controller 240.

Thus, the first relay driving signal generator 130 may output a Low signal as the first relay driving signal from the time t1 as illustrated in FIG. 2.

The second relay driving signal generator 140 may generate and output a second relay driving signal based on the first relay driving signal and the memory output signal. In this case, the first relay driving signal may be generated by the first relay driving signal generator 130 described above. Also, the memory output signal may be generated by the memory 160 described above. The second relay driving signal generator 140 according to some example embodiments of the present disclosure may generate and output a second relay driving signal based on an OR operation (i.e., an OR logic operation) result of the first relay driving signal and the memory output signal.

Thus, the second relay driving signal generator 140 may output a High signal as the second relay driving signal by the first relay driving signal before the time t1 and output a High signal as the second relay driving signal by the memory output signal from the time t1 to the time t2. After the time t2, because both the first relay driving signal and the memory output signal are Low signals, the second relay driving signal generator 140 may output a Low signal as the second relay driving signal.

Because the second relay driving signal generated by the second relay driving signal generator 140 may be output to the relay driver 250, which controls an operation of the relay 260, to control an operation of the relay 260, the present disclosure may maintain the operation state of the relay 260 despite the abnormality of the controller 240.

Figure 3:
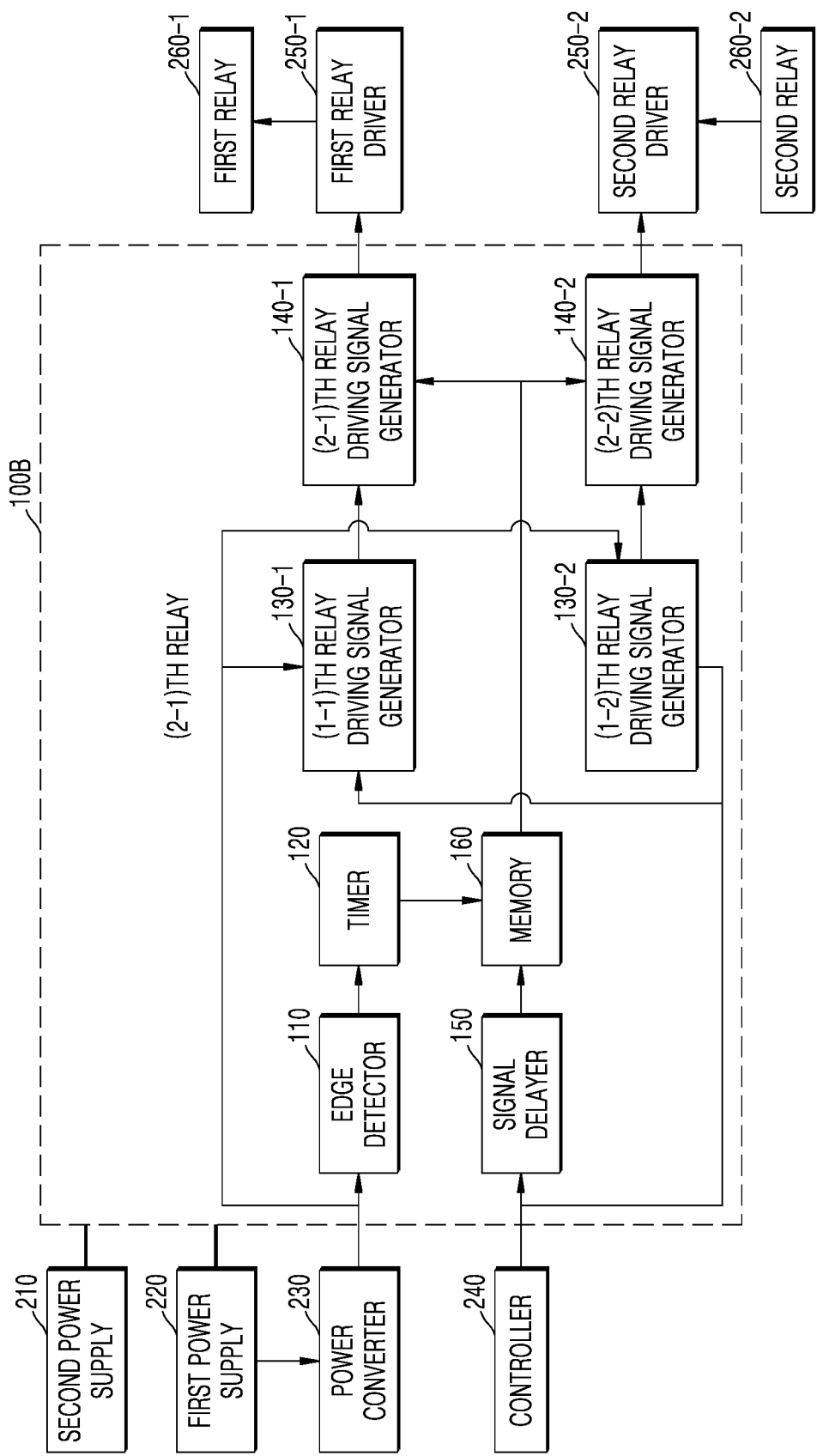
FIG. 3 illustrates a configuration of a system including a relay operation state maintaining device according to some example embodiments of the present disclosure.

FIG. 3 illustrates a configuration of a system including a relay operation state maintaining device 100B according to some example embodiments of the present disclosure.

The system including the relay operation state maintaining device 100B according to some example embodiments of the present disclosure may further include a second relay 260-2 and a second relay driver 250-2 in comparison with the embodiment described with reference to FIG. 1. Also, for control of the second relay 260-2, the relay operation state maintaining device 100B may further include a (1-2)th relay driving signal generator 130-2 and a (2-2)th relay driving signal generator 140-2.

In this case, the memory 160 according to some example embodiments of the present disclosure may store each of a first relay control signal output for an operation of a first relay 260-1 and a second relay control signal output for an operation of the second relay 260-2 by the controller 240 at the abnormality occurrence time and output each of a first memory output signal and a second memory output signal based on the stored signal.

Also, the relay operation state maintaining device 100B according to some example embodiments of the present disclosure may include a (1-1)th relay driving signal generator 130-1 for generating and outputting a (1-1)th relay driving signal based on the first relay control signal and a signal corresponding to the abnormality occurrence. Also, the relay operation state maintaining device 100B according to some example embodiments of the present disclosure may include a (1-2)th relay driving signal generator 130-2 for generating and outputting a (1-2)th relay driving signal based on the second relay control signal and the signal corresponding to the abnormality occurrence.

In addition, the relay operation state maintaining device 100B according to some example embodiments of the present disclosure may include a (2-1)th relay driving signal generator 140-1 for generating and outputting a (2-1)th relay driving signal based on the (1-1)th relay driving signal and the first memory output signal and may include a (2-2)th relay driving signal generator 140-2 for generating and outputting a (2-2)th relay driving signal based on the (1-2)th relay driving signal and the second memory output signal.

In this case, the first relay 260-1 may operate according to the (2-1)th relay driving signal generated by the (2-1)th relay driving signal generator 140-1, and the second relay 260-2 may operate according to the (2-2)th relay driving signal generated by the (2-2)th relay driving signal generator 140-2. Detailed descriptions of the respective configurations and the other configurations will be omitted for conciseness.

According to some example embodiments of the present disclosure, each of the first relay 260-1 and the second relay 260-2 may include two separate relays. For example, the first relay 260-1 may include two separate relays, and the second relay 260-2 may also include two separate relays.

In this case, two relays constituting each of the relays, that is, the first and second relays 260-1 and 260-2, may operate according to a second relay driving signal generated by the (2-1)th relay driving signal generator 140-1 or the (2-2)th relay driving signal generator 140-2 or may operate according to a second relay driving signal generated by a separate second relay driving signal generator.

Figure 4:
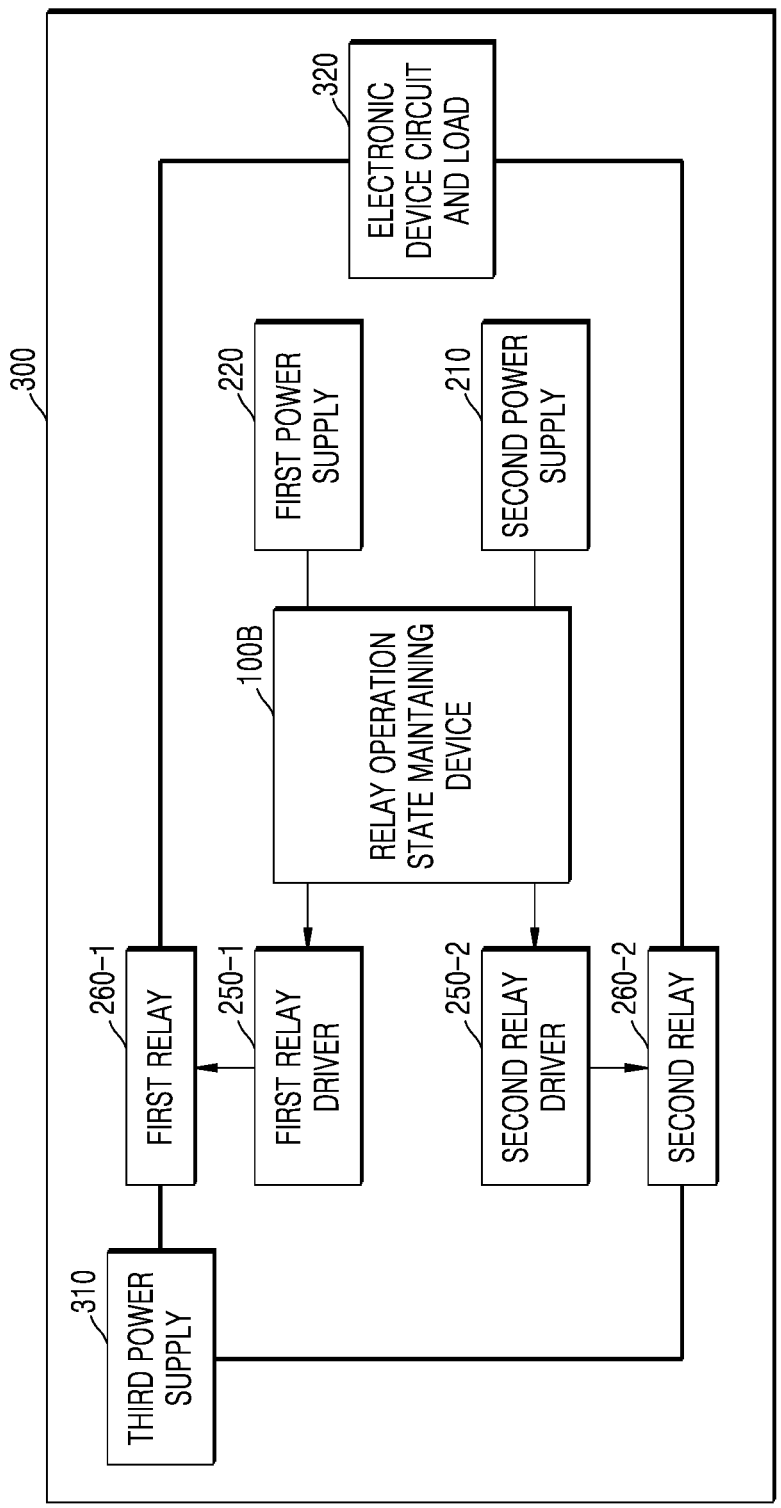
FIG. 4 is a diagram illustrating a configuration of an electronic device including a relay operation state maintaining device according to some example embodiments of the present disclosure.

FIG. 4 is a diagram illustrating a configuration of an electronic device 300 including the relay operation state maintaining device 100B according to some example embodiments of the present disclosure.

In the electronic device 300 according to some example embodiments of the present disclosure, two relays, that is, first and second relays 260-1 and 260-2, may be used to control the electrical connection of a positive line and a negative line, respectively.

For example, the first relay 260-1 may be arranged on a line connecting a positive electrode of a third power supply 310 and an electronic device circuit and load 320 corresponding thereto. For example, the second relay 260-2 may be arranged on a line connecting a negative electrode of the third power supply 310 and the electronic device circuit and the load 320 corresponding thereto. However, this is merely an example and embodiments according to the present disclosure are not limited thereto.

In this case, the first power supply 220, the second power supply 210, and the third power supply 310 may be separate power supplies that are separate from each other. For example, the first power supply 220 and the second power supply 210 may be different power supplies branched from the same battery pack for the system power supply. The third power supply 310 may be a power supply provided to drive the electronic device 300. Meanwhile, "the different power supplies branched from the same battery pack" may mean power supplies that have different detailed paths from the battery pack to the connection terminal while sharing the same base battery pack. For example, "the different power supplies branched from the same battery pack" may mean power supplies that do not share a battery management system (BMS) with each other. However, this is merely an example and embodiments according to the present disclosure are not limited thereto.

According to various embodiments of the present disclosure, it may be possible to maintain an operation state of a relay even in a failure situation of a control device controlling the relay.

For example, it may be possible to prevent or reduce instances of unintended opening of a relay in a situation such as the reset of a control device to improve the reliability of a device including the relay.

Also, it may be possible to maintain an operation state of a relay for a certain time in a failure situation of a control device controlling the relay.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A relay operation state maintaining device configured to maintain an operation state of a relay when an abnormality occurs in a controller configured to control an operation of the relay,
    the relay operation state maintaining device comprising:
        a memory configured to store a relay control signal output for an operation of the relay by the controller at a time the abnormality occurs and to generate and output a memory output signal based on a stored signal;
        a first relay driving signal generator configured to generate and output a first relay driving signal based on the relay control signal and a signal corresponding to the abnormality; and
        a second relay driving signal generator configured to generate and output a second relay driving signal based on the first relay driving signal and the memory output signal.

2. The relay operation state maintaining device of claim 1, wherein
    the memory, the first relay driving signal generator, and the second relay driving signal generator are configured to be operated by a second power supply separate from a first power supply that is configured to supply power to the controller.

3. The relay operation state maintaining device of claim 1, further comprising
    a signal delayer configured to delay the relay control signal of the controller by a certain time interval to generate and output a delayed relay control signal,
    wherein the memory is configured to store the delayed relay control signal within the certain time interval from the time the abnormality occurs, and to generate and output the memory output signal based on a stored signal.

4. The relay operation state maintaining device of claim 1, further comprising a timer configured to generate a timer output signal during a certain maintenance period from the time a triggering signal is input.

5. The relay operation state maintaining device of claim 4, wherein
    the memory is configured to generate and output the memory output signal only while the timer output signal is input.

6. The relay operation state maintaining device of claim 4, further comprising an edge detector configured to generate the triggering signal based on the signal corresponding to the abnormality and to output the triggering signal to the timer.

7. The relay operation state maintaining device of claim 1, wherein
    the first relay driving signal generator is configured to generate and output the first relay driving signal based on an AND operation result of the relay control signal and the signal corresponding to the abnormality.

8. The relay operation state maintaining device of claim 1, wherein
    the second relay driving signal generator is configured to generate and output the second relay driving signal based on an OR operation result of the first relay driving signal and the memory output signal.

9. The relay operation state maintaining device of claim 1, wherein the second relay driving signal is output to a relay driver controlling an operation of the relay.

10. The relay operation state maintaining device of claim 1, wherein
    the relay comprises a first relay and a second relay,
    and the memory is configured to store each of a first relay control signal output for an operation of the first relay and a second relay control signal output for an operation of the second relay by the controller at the time the abnormality occurs, and to output each of a first memory output signal and a second memory output signal based on a stored signal,
    the first relay driving signal generator comprises:
        a (1-1)th relay driving signal generator configured to generate and output a (1-1)th relay driving signal based on the first relay control signal and the signal corresponding to the abnormality; and
        a (1-2)th relay driving signal generator configured to generate and output a (1-2)th relay driving signal based on the second relay control signal and the signal corresponding to the abnormality, and
    the second relay driving signal generator comprises:
        a (2-1)th relay driving signal generator configured to generate and output a (2-1)th relay driving signal based on the (1-1)th relay driving signal and the first memory output signal; and
        a (2-2)th relay driving signal generator configured to generate and output a (2-2)th relay driving signal based on the (1-2)th relay driving signal and the second memory output signal.

11. An electronic device having a relay operation state maintaining device configured to maintain an operation state of a relay in response to an abnormality occurring in a controller configured to control an operation of the relay and of which a third power supply is adjusted by the relay, the electronic device comprising:
    the relay configured to control the third power supply to the electronic device;
    a relay driver configured to control an operation of the relay based on a second relay driving signal; and
    a memory configured to store a relay control signal output for an operation of the relay by the controller at a time the abnormality occurs, and to generate and output a memory output signal based on a stored signal,
    wherein the relay operation state maintaining device is configured to generate and output the second relay driving signal for maintaining an operation state of the relay in response to the abnormality occurring.

12. The electronic device of claim 11, wherein the relay operation state maintaining device comprises:
    a first relay driving signal generator configured to generate and output a first relay driving signal based on the relay control signal and a signal corresponding to the abnormality; and a second relay driving signal generator configured to generate and to output the second relay driving signal based on the first relay driving signal and the memory output signal.

13. The electronic device of claim 12, wherein the memory, the first relay driving signal generator, and the second relay driving signal generator are configured to be operated by a second power supply separate from a first power supply configured to supply power to the controller, and the first power supply, the second power supply, and the third power supply are separate power supplies.

14. The electronic device of claim 12, wherein the relay operation state maintaining device further comprises a signal delayer configured to delay the relay control signal of the controller by a certain time interval to generate and output a delayed relay control signal, and the memory is configured to store the delayed relay control signal within the certain time interval from the time the abnormality occurs, and to generate and to output the memory output signal based on a stored signal.

15. The electronic device of claim 12, wherein the relay operation state maintaining device further comprises a timer configured to generate a timer output signal during a certain maintenance period from the time a triggering signal is input.

16. The electronic device of claim 15, wherein the memory is configured to generate and to output the memory output signal only while the timer output signal is input.

17. The electronic device of claim 15, wherein the relay operation state maintaining device further comprises an edge detector configured to generate the triggering signal based on the signal corresponding to the abnormality and to output the triggering signal to the timer.

18. The electronic device of claim 12, wherein the first relay driving signal generator is configured to generate and to output the first relay driving signal based on an AND operation result of the relay control signal and the signal corresponding to the abnormality, and the second relay driving signal generator is configured to generate and to output the second relay driving signal based on an OR operation result of the first relay driving signal and the memory output signal.

19. The electronic device of claim 12, wherein the second relay driving signal is output to a relay driver configured to control an operation of the relay.

20. The electronic device of claim 12, wherein the relay comprises a first relay and a second relay, the memory is configured to store each of a first relay control signal output for an operation of the first relay and a second relay control signal output for an operation of the second relay by the controller at a time the abnormality occurs, and to output each of a first memory output signal and a second memory output signal based on a stored signal, the first relay driving signal generator comprises:

a (1-1)th relay driving signal generator configured to generate and output a (1-1)th relay driving signal based on the first relay control signal and the signal corresponding to the abnormality; and a (1-2)th relay driving signal generator configured to generate and output a (1-2)th relay driving signal based on the second relay control signal and the signal corresponding to the abnormality, and the second relay driving signal generator comprises:

a (2-1)th relay driving signal generator configured to generate and output a (2-1)th relay driving signal based on the (1-1)th relay driving signal and the first memory output signal; and a (2-2)th relay driving signal generator configured to generate and output a (2-2)th relay driving signal based on the (1-2)th relay driving signal and the second memory output signal.

* * * * *